United States Patent
Lee et al.

(10) Patent No.: US 7,988,874 B2
(45) Date of Patent: Aug. 2, 2011

(54) METHOD OF FABRICATING SEMICONDUCTOR DEVICE AND SYNCHRONOUS PULSE PLASMA ETCHING EQUIPMENT FOR THE SAME

(75) Inventors: Jeong-Yun Lee, Yongin-si (KR); Ken Tokashiki, Seongnam-si (KR); Kyoung-Sub Shin, Seongnam-si (KR); Jun-Ho Yoon, Suwon-si (KR); Hong Cho, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/913,965

(22) Filed: Oct. 28, 2010

(65) Prior Publication Data

US 2011/0143537 A1     Jun. 16, 2011

(30) Foreign Application Priority Data

Dec. 14, 2009   (KR) .................. 10-2009-0124210

(51) Int. Cl.
  *C03C 15/00*   (2006.01)
  *C03C 25/68*   (2006.01)
  *H01L 21/302*  (2006.01)
  *H01L 21/461*  (2006.01)
(52) U.S. Cl. .......................... 216/67; 216/68; 438/710
(58) Field of Classification Search .................. 438/710; 216/67, 68; 257/E21.218
See application file for complete search history.

(56) References Cited

U.S. PATENT DOCUMENTS

| | | | |
|---|---|---|---|
| 5,983,828 A * | 11/1999 | Savas | 118/723 I |
| 6,770,332 B2 | 8/2004 | Nakase et al. | |
| 2001/0051438 A1 | 12/2001 | Shin et al. | |
| 2003/0151372 A1 * | 8/2003 | Tsuchiya et al. | 315/111.81 |
| 2006/0246661 A1 | 11/2006 | Joo et al. | |
| 2010/0130018 A1 * | 5/2010 | Tokashiki et al. | 438/710 |

FOREIGN PATENT DOCUMENTS

| | | |
|---|---|---|
| JP | 11-067741 A | 3/1999 |
| JP | 11-214383 A | 8/1999 |
| JP | 2000-311890 A | 11/2000 |
| KR | 10-0253080 B1 | 1/2000 |
| KR | 10-0317915 B1 | 12/2001 |
| KR | 10-0477402 B1 | 3/2005 |
| KR | 10-0636022 B1 | 10/2006 |

* cited by examiner

*Primary Examiner* — William M. Brewster
(74) *Attorney, Agent, or Firm* — Sughrue Mion, PLLC

(57) ABSTRACT

Provided are a method of fabricating a semiconductor device and synchronous pulse plasma etching equipment for the same. The method includes outputting a first radio frequency (RF) power and a control signal and outputting a second RF power. The first RF power is pulse-width modulated to have a first frequency and a first duty ratio, and is applied to a first electrode in a plasma etching chamber. The control signal includes information on a phase of the first RF power. The second RF power is pulse-width modulated to have the first frequency and a second duty ratio smaller than the first duty ratio, is applied to a corresponding second electrode among second electrodes in the plasma etching chamber, and is supplied for a time section in which the first RF power is supplied.

10 Claims, 5 Drawing Sheets

METHOD OF FABRICATING SEMICONDUCTOR DEVICE AND SYNCHRONOUS PULSE PLASMA ETCHING EQUIPMENT FOR THE SAME

CROSS-REFERENCE TO RELATED APPLICATIONS

This application claims the priority under 35 U.S.C. §119 from Korean Patent Application No. 10-2009-124210, filed on Dec. 14, 2009, the contents of which are hereby incorporated herein by reference in its entirety.

1. FIELD

Exemplary embodiments relate to a method of fabricating a semiconductor device. Other exemplary embodiments relate to a method of fabricating a semiconductor device and synchronous pulse plasma etching equipment for the same that are capable of synchronizing and supplying a plurality of pulse-width modulated radio frequencies to perform an etching process.

SUMMARY

Among semiconductor processes, an etching process refers to a process of removing a lower layer along a photosensitive layer pattern on a wafer, and may be a dry etching process or a wet etching process. In recent times, a dry etching method using plasma has been widely used to form fine semiconductor patterns. The plasma etching method is a method of injecting a reaction gas into a plasma etching chamber, colliding ionized particles with a wafer surface after generation of plasma, and removing a material using physical or chemical reaction therebetween.

Plasma is generated by applying radio frequency (RF) power as an energy source through a capacitively coupled plasma (CCP) method of applying RF power between opposite parallel plates to generate plasma, or an inductively coupled plasma (ICP) method of applying RF power to a coil outside a reaction tube to generate plasma. In addition, when the RF power is pulse-width modulated and applied, an electron temperature, a plasma density, and a plasma potential are decreased when the RF power is turned off (i.e., after glow) so that charging damage and radiation damage may be attenuated.

Exemplary embodiments provide a method of fabricating a semiconductor device capable of synchronously applying a plurality of pulse-width modulated RF powers, and reducing the number of ionized particles having a high energy level.

Exemplary embodiments also provide synchronous pulse plasma etching equipment for accomplishing the above aspect.

Exemplary embodiments are directed to a method of fabricating a semiconductor device including: outputting a first radio frequency (RF) power; and a control signal and outputting a second RF power. The first RF power is pulse-width modulated to have a first frequency and a first duty ratio, and is applied to a first electrode in a plasma etching chamber. The control signal includes information on a phase of the first RF power. The second RF power is pulse-width modulated to have the first frequency and a second duty ratio smaller than the first duty ratio, is applied to a corresponding second electrode among second electrodes in the plasma etching chamber, and is supplied for a time section during which the first RF power is supplied.

In exemplary embodiments, plasma may be generated in the plasma etching chamber through the first electrode, and ion energy entering a wafer may be adjusted through the second electrode.

In exemplary embodiments, the second RF power may be supplied after a first time elapses from the supply of the first RF power.

In exemplary embodiments, supply of the second RF power may be stopped a second time before stoppage of the supply of the first RF power, or may be stopped at the same time as stoppage of the supply of the first RF power.

In exemplary embodiments, the first frequency may be 10 kHz or less, and the first time may be 10 µs or more.

In exemplary embodiments, the outputting the first RF power output and the first control signal may include outputting a pulse signal having the first frequency and the first duty ratio, and the control signal; outputting a first RF signal having a second frequency; mixing the first RF signal and the first pulse signal to output the first RF power; and matching a load impedance of the first electrode with a characteristic impedance of a cable connecting the first RF power output part to the first electrode to transmit a maximum wattage of the first RF power to the first electrode.

In exemplary embodiments, the outputting the second RF power may include outputting a second pulse signal having the first frequency and the first duty ratio and activated only in a section in which the first pulse signal is activated, in response to the control signal; outputting a second RF signal having the second frequency; mixing the second RF signal and the second pulse signal to output the second RF power; and matching a load impedance of the second electrode with a characteristic impedance of a cable connecting the second RF power output part to the second electrode to transmit a maximum wattage of the second RF power to the second electrode.

In exemplary embodiments, the second pulse signal may be activated after the first time elapses from activation of the first pulse signal.

In exemplary embodiments, the method may further include depositing a metal layer on the entire surface of a wafer; forming photoresist on a portion of the metal layer; and removing the photoresist and other impurities, wherein the metal layer is etched where the photoresist is not formed through the first RF power output operation and the second RF power output operation.

Other exemplary embodiments also directed to synchronous pulse plasma etching equipment including: a first electrode and at least one second electrode configured to generate plasma in a plasma etching chamber; a first RF power output part configured to apply first RF power pulse-width modulated and having a first frequency and a first duty ratio to the first electrode, and output a control signal including information on a phase of the first RF power; and at least one second RF power output part configured to apply second RF power pulse-width modulated and having the first frequency and a second duty ratio smaller than the first duty ratio to a corresponding second electrode among the second electrodes. Here, the second RF power is supplied only for a time section during which the first RF power is supplied.

In exemplary embodiments, plasma may be generated in the plasma etching chamber through the first electrode, and ion energy entering a wafer may be adjusted through the second electrode.

In exemplary embodiments, the second RF power output part may supply the second RF power after a first time elapses from supply of the first RF power.

In exemplary embodiments, the second RF power output part may stop supply of the second RF power a second time before stoppage of the supply of the first RF power, or may stop supply of the second RF power at the same time as stoppage of the supply of the first RF power.

In exemplary embodiments, the first frequency may be 10 kHz or less, and the first time may be 10 μs or more.

In exemplary embodiments, the first RF power output part may include: a first controller configured to output a first pulse signal having the first frequency and the first duty ratio, and the control signal; a first RF generator configured to output a first RF signal having a second frequency; a first mixer configured to mix the first RF signal and the first pulse signal and output the first RF power; and a first match network configured to match a load impedance of the first electrode with a characteristic impedance of a cable connecting the first RF power output part to the first electrode, and transmit a maximum wattage of the first RF power to the first electrode.

In exemplary embodiments, the second RF power output part may include: a second controller configured to output a second pulse signal having the first frequency and the second duty ratio and activated for a time section during which the first pulse signal is activated, in response to the control signal; a second RF generator configured to output a second RF signal having the second frequency; a second mixer configured to mix the second RF signal and the second pulse signal and output the second RF power; and a second match network configured to match a load impedance of the second electrode with a characteristic impedance of a cable connecting the second RF power output part to the second electrode, and transmit a maximum wattage of the second RF power to the second electrode.

In exemplary embodiments, the second controller may activate the second pulse signal after the first time elapses from activation of the first pulse signal.

BRIEF DESCRIPTION OF THE DRAWINGS

Exemplary embodiments are described in further detail below with reference to the accompanying drawings. It should be understood that various aspects of the drawings may have been exaggerated for clarity.

DETAILED DESCRIPTION OF EXEMPLARY EMBODIMENTS

Figure 1:
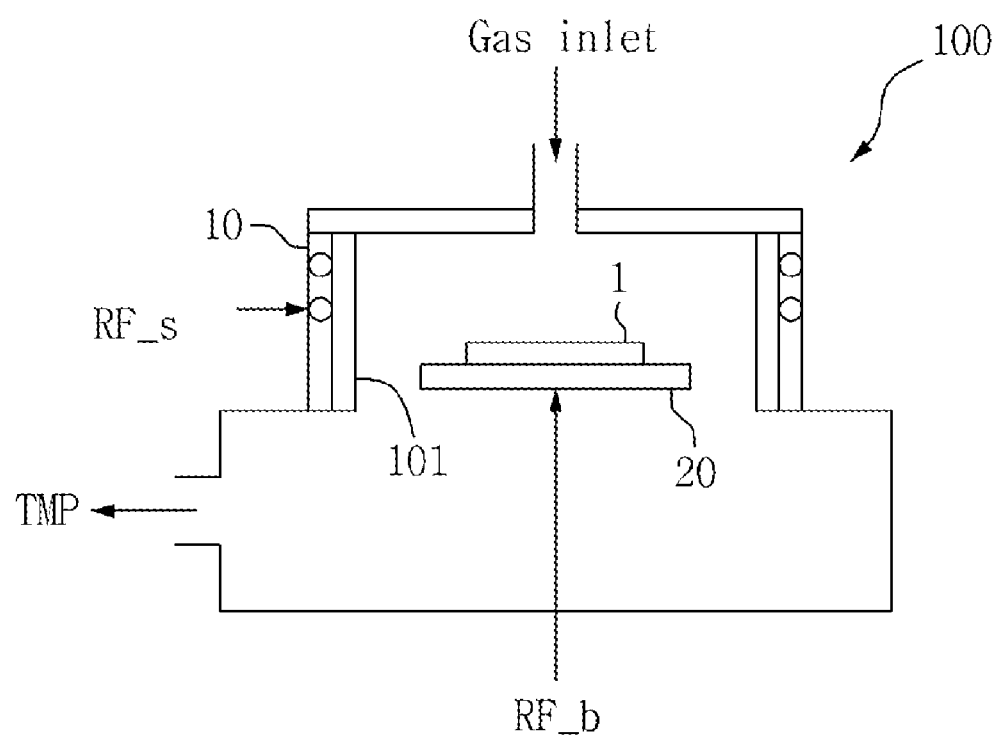
FIG. 1 is a view showing constitution of a plasma etching chamber of synchronous pulse plasma etching equipment in accordance with an exemplary embodiment of the inventive concept.

Various exemplary embodiments will now be described more fully with reference to the accompanying drawings in which some exemplary embodiments are shown. In the drawings, the thicknesses of layers and regions may be exaggerated for clarity.

Detailed illustrative embodiments are disclosed herein. However, specific structural and functional details disclosed herein are merely representative for purposes of describing exemplary embodiments. This inventive concept, however, may be embodied in many alternate forms and should not be construed as limited to only exemplary embodiments set forth herein.

Accordingly, while exemplary embodiments are capable of various modifications and alternative forms, embodiments thereof are shown by way of example in the drawings and will herein be described in detail. It should be understood, however, that there is no intent to limit exemplary embodiments to the particular forms disclosed, but on the contrary, exemplary embodiments are to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, exemplary embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe exemplary embodiments, various aspects will be described in detail with reference to the attached drawings. However, the inventive concept is not limited to exemplary embodiments described.

FIG. 1 is a view showing constitution of a plasma etching chamber 100 of synchronous pulse plasma etching equipment in accordance with an exemplary embodiment of the inventive concept. The plasma etching equipment shown in FIG. 1 uses an inductively coupled plasma (ICP) method. The plasma etching chamber 100 includes a ceramic wall 101, a source electrode 10, and a bias electrode 20. In FIG. 1, reference numeral 1 designates a wafer.

The ceramic wall 101 may have a cylindrical shape, and the source electrode 10 may be formed in a coil shape surrounding the ceramic wall 100 in at least one turn. The bias electrode 20 is disposed under the source electrode 10 and functions to support the wafer 1.

RF source power RF_s is applied, i.e., supplied, to the source electrode 10, and RF bias power RF_b is applied to the bias electrode 20. A plasma etching gas is introduced into the plasma etching chamber 100 through a gas inlet, and discharged to the exterior of the plasma etching chamber 100 through a turbo molecular pump (TMP).

In the case of CCP type plasma etching equipment, the source electrode may be formed in a plate shape adjacent to the gas inlet.

Figure 2:
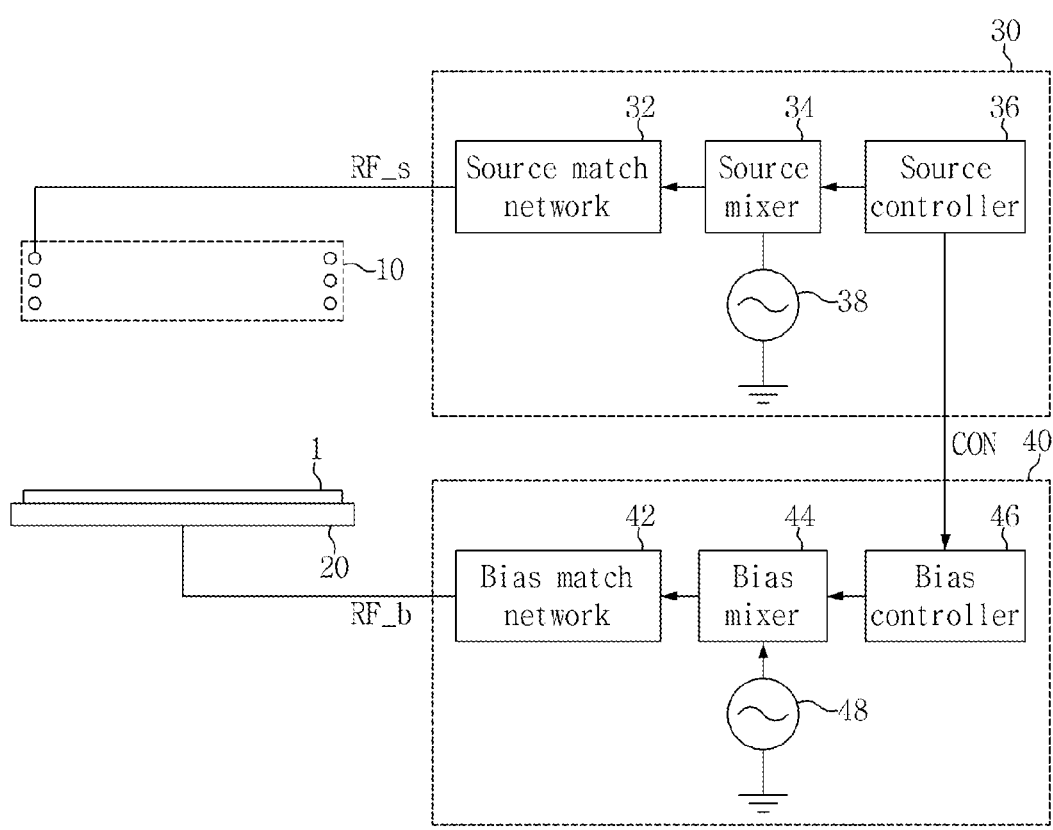
FIG. 2 is a block diagram of synchronous pulse plasma etching equipment in accordance with an exemplary embodiment of the inventive concept.

FIG. 2 is a block diagram of synchronous pulse plasma etching equipment in accordance with an exemplary embodiment of the inventive concept. The plasma etching equipment shown in FIG. 2 uses an ICP method. The synchronous pulse plasma etching equipment may include a source electrode 10, a bias electrode 20, a RF source power output part 30, a RF bias power output part 40, and a mode selection part 50. In addition, the RF source power output part 30 may include a source match network 32, a source mixer 34, a source controller 36, and a source RF generator 38. The RF bias power output part 40 may include a bias match network 42, a bias mixer 44, a bias controller 46, and a bias RF generator 48. In FIG. 2, reference numeral 1 designates a wafer.

Functions of blocks shown in FIG. 2 will be described as follows.

The source electrode 10 and the bias electrode 20 form plasma in the plasma etching chamber.

The source electrode 10 receives RF source power RF_s output from the RF source power output part 30. The source electrode 10 particularly helps generate plasma in the plasma etching chamber.

The bias electrode 20 receives RF bias power RF_b output from the RF bias power output part 30. The bias electrode 20 particularly helps adjust ion energy entering the wafer 1.

The RF source power output part 30 outputs pulse-width modulated RF source power RF_s having a first frequency and a first duty ratio to the source electrode 10, and outputs a control signal CON including information on a phase of the RF source power RF_s to the RF bias power output part 40.

The source RF generator 38 may be constituted by an oscillator, etc., and outputs a source RF signal having a second frequency (for example, a RF region from 100 kHz to 100 MHz, or a frequency of very high frequency (VHF) and ultra high frequency (UHF) regions or more).

The source controller 36 outputs a source pulse signal having the first frequency and the first duty ratio and a control signal CON including information on a phase of the source pulse signal. The control signal CON may be the same signal as the source pulse signal.

The source mixer 34 inputs and mixes the source RF signal output from the source RF generator 38 and the source pulse signal output from the source controller 36 to output the pulse-width modulated RF source power.

The source match network 32 matches a characteristic impedance of a cable from the RF source power output part 30 to the source electrode 10 and a load impedance of the plasma etching chamber (not shown). That is, the source match network 32 matches the impedances such that a maximum wattage of the RF source power output from the source mixer 34 of the RF source power output part 30 can be transmitted to the source electrode 10.

The first frequency may be adjusted depending on the second frequency. It will be experimentally confirmed that when the second frequency is in the frequency range of RF, VHF and UHF, charging damage and radiation damage can be substantially attenuated when the first frequency is less than about 10 kHz.

The RF bias power output part 40 outputs the pulse-width modulated RF bias power RF_b having the first frequency and a second duty ratio smaller that the first duty ratio, synchronized with the RF source power RF_s, and embedded into the RF source power RF_s to the bias electrode 20 in response to the control signal CON output from the RF source power output part 30. That is, the RF bias power output part 40 turns on the RF bias power RF_b after a first time T1 elapses from the turn-on of the RF source power RF_s. In addition, the RF bias power output part 40 turns off the RF bias power RF_b before a second time T2 from the turn-off of the RF source power RF_s or at the same time the RF source power RF_s is turned off. In other words, the RF bias power output part 40 outputs the RF bias power RF_b turned on for a shorter time than the time the RF source power RF_s is turned on, only within a section in which the RF source power RF_s is turned on.

It will be experimentally confirmed that a percentage of ionized particles having a high energy level is substantially reduced when the first time T1 is more than 10 μs. In addition, the first duty ratio may be about 50%, and in this case, the second duty ratio may be about 40%. That is, for example, when the first frequency is 5 kHz, the first duty ratio is 50%, and the second duty ratio is about 40%, the first time T1 may be determined among values from 10 μs to 100 μs. In this case, when the first time T1 is determined to be about 10 μs, the second time T2 may be about 10 μs. The first time T1 may be determined depending on the first frequency, the first duty ratio, the second duty ratio, and the second time T2. As described above, the first frequency, the first duty ratio, the second duty ratio, and the second time T2 may be determined such that the first time T1 is more than 10 μs.

The bias RF generator 48 may be constituted by an oscillator, etc., and outputs a bias RF signal having the second frequency (for example, a RF region from 100 kHz to 100 MHz, or a frequency of VHF and UHF regions or more).

The bias controller 46 outputs a bias pulse signal having the first frequency and the second duty ratio, synchronized with the source pulse signal, and embedded into the source pulse signal, in response to the control signal CON. That is, the bias controller 46 may activate the bias pulse signal after the first time elapses from activation of the source pulse signal in response to the control signal CON, and may inactivate the bias pulse signal before the second time from inactivation of the source pulse signal or at the same time the source pulse signal is inactivated. In other words, the bias controller 46 may output the bias pulse signal activated for a shorter time than the time the source pulse signal is activated, only within a section in which the source pulse signal is activated.

The bias mixer 44 inputs and mixes a bias RF signal output from the bias RF generator 48 and a bias pulse signal output from the bias controller 46 to output a pulse-width modulated RF bias power.

The bias match network 42 matches a characteristic impedance of a cable from the RF bias power output part 40 to the bias electrode 20 and a load impedance of the plasma etching chamber (not shown). That is, the bias match network 42 matches the impedances such that a maximum wattage of the RF bias power output from the bias mixer 44 of the RF bias power output part 40 can be transmitted to the bias electrode 20.

When the RF bias power RF_b is turned on at the same time as or before the RF source power RF_s, since the plasma is discharged in a large resistance state, ionized particles having a high energy level are generated. Therefore, the synchronous plasma etching equipment of the inventive concept turns on the RF bias power RF_b after the first time T1 elapses from the turn-on of the RF source power RF_s.

In addition, if the RF bias power RF_b is turned off later than the RF source power RF_s, there is a state in which only the RF bias power is turned on. Even in this case, since the plasma is discharged in a large resistance state, ionized particles having a high energy level are generated. Therefore, the synchronous plasma etching equipment of the inventive concept turns off the RF bias power RF_b before the second time T2 from the turn-off of the RF source power RF_s, or at the same time the RF source power RF_s is turned off.

That is, the synchronous pulse plasma etching equipment in accordance with an exemplary embodiment of the inventive concept shown in FIG. 2 synchronizes the RF bias power RF_b applied to the bias electrode 20 with the RF source power RF_s applied to the source electrode 10, the RF bias power RF_b being turned on for a shorter time than the time that the RF source power RF_s is turned on, within a section in which the RF source power RF_s is turned on.

Figure 3:
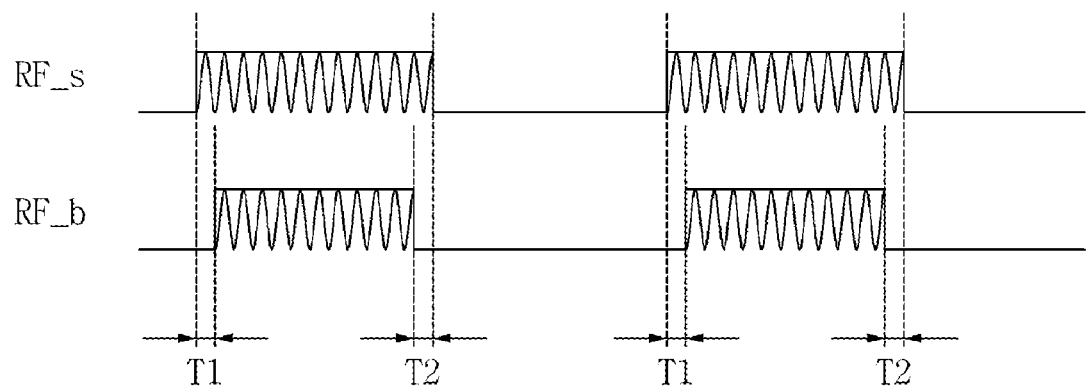
FIGS. 3 and 4 are views for explaining operations of synchronous pulse plasma etching equipment in accordance with an exemplary embodiment of the inventive concept.
Figure 4:
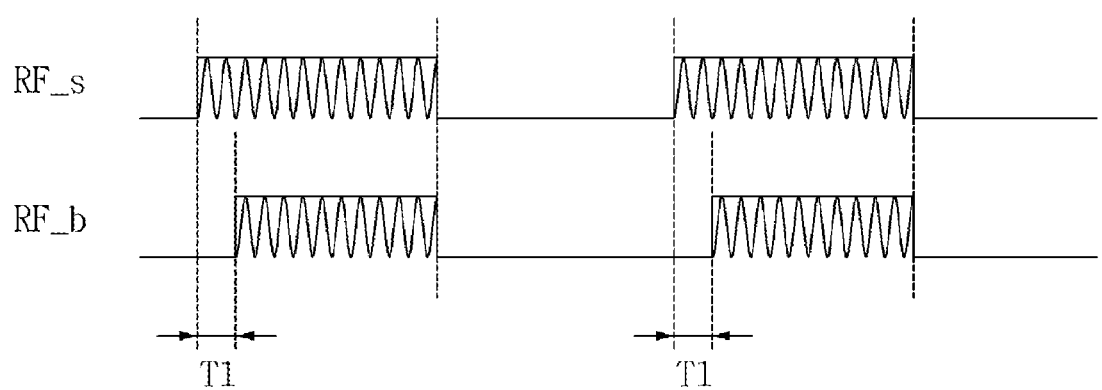

FIGS. 3 and 4 are views for explaining operations of synchronous pulse plasma etching equipment in accordance with an exemplary embodiment of the inventive concept. In FIGS. 3 and 4, RF_s represents RF source power, and RF_b represents RF bias power.

As shown in FIG. 3, the synchronous pulse plasma etching equipment of the inventive concept outputs the RF source power RF_s and the RF bias power RF_b having the same first frequency (for example, 5 kHz).

In addition, the synchronous pulse plasma etching equipment turns on the RF bias power RF_b after the first time T1 from the turn-on of the RF source power RF_s. When the first frequency is 5 kHz, the first time T1 may be about 10 μs.

Further, the synchronous pulse plasma etching equipment turns off the RF bias power RF_b before the second time T2 from the turn-off of the RF source power RF_s. When the first frequency is 5 kHz, the second time T2 may be about 10 μs.

Furthermore, the RF bias power RF_b has a duty ratio smaller than that of the RF source power RF_s. The RF source power RF_s may have a duty ratio of 50%, and the RF bias power RF_b may have a duty ratio of 40%.

In the exemplary embodiment shown in FIG. 4, the synchronous pulse plasma etching equipment turns on the RF bias power RF_b after the time T1 elapses from the turn-on of the RF source power RF_s, and turns off the RF bias power RF_b when the RF source power RF_s is turned off. When the first frequency is 5 kHz, the first time T1 may be 20 μs.

Figure 5:
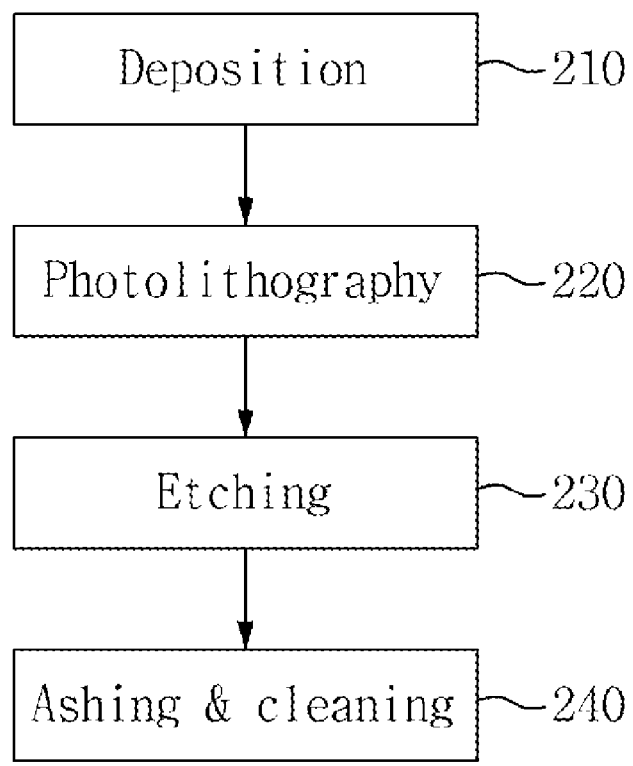
FIG. 5 is a flowchart for explaining a method of fabricating a semiconductor device in accordance with an exemplary embodiment of the inventive concept.

FIG. 5 is a flowchart for explaining a method of fabricating a semiconductor device in accordance with an exemplary embodiment of the inventive concept. The method of fabricating a semiconductor device may include a deposition operation 210, a photolithography operation 220, an etching operation 230, and an ashing and cleaning operation 240.

In the deposition operation 210, a metal layer is deposited on the entire surface of a wafer. In the photolithography operation 220, a photoresist is formed on a portion of the metal layer. In the etching operation 230, the metal layer is removed where the photoresist is not formed. The etching operation 230 is performed using the synchronous pulse plasma etching equipment in accordance with the inventive concept. In the ashing and cleaning operation 240, the photoresist and other impurities are removed.

An operator may etch a silicon material (single crystal Si, polycrystalline Si, high melting point metal silicide), various silicon oxide layer materials, various silicon nitride layer materials, low permittivity materials (HSQ, MSQ, porous silica, etc.), various organic layer materials (CVD type, spin-on type, etc.), various metal materials (for example, W, WN, Ti, TiN, Ta, TaN, Mo, Al, and other semiconductor materials), or other high permittivity materials, on the wafer, using the synchronous pulse plasma etching equipment.

While the above exemplary embodiment illustrates the ICP type pulse plasma etching equipment, the concept of the inventive concept may be applied to another type of plasma etching equipment such as CCP type pulse plasma etching equipment, etc.

In addition, while the above exemplary embodiment illustrates two types of RF powers such as the RF source power and the RF bias power, when a plurality of RF powers are applied, the concept of the inventive concept may be applied with reference to any one phase of the plurality of RF powers. In this case, the synchronous pulse plasma etching equipment may include a plurality of electrodes, to which RF power corresponding to each of the plurality of RF powers is applied to generate plasma.

As can be seen from the foregoing, a method of fabricating a semiconductor device and synchronous pulse plasma etching equipment for the same in accordance with the inventive concept can reduce the number of ionized particles having a high energy level to maintain advantages of the synchronous pulse plasma etching equipment and prevent damage to the semiconductor device due to the ionized particles having the high energy level.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific embodiments disclosed, and that modifications to the disclosed embodiments, as well as other embodiments, are intended to be included within the scope of the appended claims.

What is claimed is:

1. A method of fabricating a semiconductor device comprising:
    outputting a first radio frequency (RF) power and a control signal, wherein the first RF power is pulse-width modulated to have a first frequency and a first duty ratio and is supplied to a first electrode in a plasma etching chamber, and the control signal includes information on a phase of the first RF power; and
    outputting a second RF power, wherein the second RF power is pulse-width modulated to have the first frequency and a second duty ratio smaller than the first duty ratio, is supplied to a corresponding second electrode among second electrodes in the plasma etching chamber, and is supplied for a time during which the first RF power is supplied.

2. The method according to claim 1, wherein plasma is generated in the plasma etching chamber through the first electrode, and ion energy entering a wafer is adjusted through the corresponding second electrode.

3. The method according to claim 1, wherein the second RF power is supplied after the first RF power is supplied for a first time.

4. The method according to claim 3, wherein a supply of the second RF power is stopped at a second time before the supply of the first RF power is stopped.

5. The method according to claim 3, wherein a supply of the second RF power is stopped at a same time when the supply of the first RF power is stopped.

6. The method according to claim 3, wherein the first frequency is 10 kHz or less, and the first time is 10 μs or more.

7. The method according to claim 1, wherein the outputting the first RF power and the control signal comprises:
    outputting the control signal and a pulse signal, wherein the pulse signal has the first frequency and the first duty ratio;
    outputting a first RF signal having a second frequency;
    mixing the first RF signal and the first pulse signal to output the first RF power; and
    matching a load impedance of the first electrode with a characteristic impedance of a cable connecting a first RF power output part to the first electrode to transmit a maximum wattage of the first RF power to the first electrode.

8. The method according to claim 7, wherein the outputting the second RF power comprises:
    outputting a second pulse signal having the first frequency and the first duty ratio and activated only in a time during which the first pulse signal is activated, in response to the control signal;
    outputting a second RF signal having the second frequency;
    mixing the second RF signal and the second pulse signal to output the second RF power; and
    matching a load impedance of the corresponding second electrode with a characteristic impedance of a cable connecting the second RF power output part to the corresponding second electrode to transmit a maximum wattage of the second RF power to the corresponding second electrode.

9. The method according to claim 8, wherein the second pulse signal is activated a first time after an activation of the first pulse signal.

10. The method according to claim 1, further comprising:
    depositing a metal layer on an entire surface of a wafer;
    forming a photoresist on a portion of the metal layer; and
    removing the photoresist and other impurities,
    wherein the metal layer is etched where the photoresist is not formed through the first RF power output operation and the second RF power output operation.

* * * * *